(12) United States Patent
Domes

(10) Patent No.: US 9,698,772 B2
(45) Date of Patent: Jul. 4, 2017

(54) DRIVE CIRCUIT FOR REVERSE-CONDUCTING IGBTS

(71) Applicant: Infineon Technologies AG, Neubiberg (DE)

(72) Inventor: Daniel Domes, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/862,582

(22) Filed: Sep. 23, 2015

(65) Prior Publication Data

US 2016/0094216 A1   Mar. 31, 2016

(30) Foreign Application Priority Data

Sep. 29, 2014   (DE) .................. 10 2014 114 085

(51) Int. Cl.
*H03K 17/567*   (2006.01)

(52) U.S. Cl.
CPC ... *H03K 17/567* (2013.01); *H03K 2217/0036* (2013.01)

(58) Field of Classification Search
CPC ............. H03K 17/00; H03K 17/04126; H03K 17/063; H03K 17/0826; H03K 17/567; H03K 17/601; H03K 2217/00; H03K 2217/0036
USPC ........................................................ 327/109
See application file for complete search history.

(56) References Cited

U.S. PATENT DOCUMENTS

| 2007/0231973 | A1  | 10/2007 | Ruething et al. | |
| 2013/0147523 | A1* | 6/2013  | Deboy | H03K 17/166 327/108 |
| 2014/0320178 | A1* | 10/2014 | Hosini | H03K 17/08128 327/109 |
| 2015/0188532 | A1* | 7/2015  | Lenz | H03K 5/023 327/109 |

FOREIGN PATENT DOCUMENTS

DE    102009001029 B4   12/2010

* cited by examiner

*Primary Examiner* — Lincoln Donovan
*Assistant Examiner* — David Mattison
(74) *Attorney, Agent, or Firm* — Murphy, Bilak & Homiller, PLLC

(57) ABSTRACT

A drive circuit includes a first output node for connection to the control electrode of the semiconductor switch, a voltage supply circuit, and a first switching stage connected to the voltage supply and a second switching stage connected to the voltage supply. A first resistor network is connected between the first switching stage and the first output node. A second resistor network is connected between the second switching stage and the first output node. A control logic is designed to generate control signals for the guiding of the first switching stage and the second switching stage in such a way that in a first operating mode of the semiconductor switch the semiconductor switch is driven only via the first resistor network, and in a second operating mode of the semiconductor switch the semiconductor switch is driven only via the second resistor network or both resistor networks.

10 Claims, 5 Drawing Sheets

| Zustand | Steuersignale | | Ausgangspotential $V_{OUT}$ / Stromflussrichtung | | | |
|---|---|---|---|---|---|---|
| | $S_1$ | $S_2$ | $i_{OUT} > 0$ | | $i_{OUT} < 0$ | |
| I | 0 | 0 | $V_{EE}$ | rückwärts | $V_{CC}$ | rückwärts |
| II | 0 | 1 | $V_{EE}$ | rückwärts | $V_{EE}$ | vorwärts |
| III | 1 | 0 | $V_{CC}$ | vorwärts | $V_{CC}$ | rückwärts |
| IV | 1 | 1 | verboten (Brückenkurzschluss) | | | |

| SW$_2$ | Nr. | Zustand | V$_{GE}$ | SW$_1$ | SW$_2$ | SW$_3$ | SW$_4$ | SW$_5$ | SW$_6$ |
|---|---|---|---|---|---|---|---|---|---|
| IGBT-Betrieb | 1 | ein | >0 | 1 | 0 | 0 | 0 | 0 | 1 |
| | 2 | aus | <0 | 0 | 1 | 0 | 0 | 1 | 0 |
| | 3 | aus | =0 | 1 | 0 | 0 | 0 | 1 | 0 |
| Dioden-betrieb | 4 | ein | >0 | 0 | 0 | 1 | 0 | 0 | 1 |
| | 5 | aus | <0 | 0 | 0 | 0 | 1 | 1 | 0 |
| | 6 | aus | =0 | 0 | 0 | 1 | 0 | 1 | 0 |

DRIVE CIRCUIT FOR REVERSE-CONDUCTING IGBTS

PRIORITY CLAIM

This application claims priority to German Patent Application No. 10 2014 114 085.0 filed on 29 Sep. 2014, the content of said application incorporated herein by reference in its entirety.

TECHNICAL FIELD

The invention relates to a circuit arrangement and a method for driving a reverse-conducting IGBT, also referred to as RC-IGBT (reverse-conducting insulated gate bipolar transistor).

BACKGROUND

In the field of power electronics, transistors for a multiplicity of applications have to be able to carry current in the reverse direction. In the case of the MOSFET, the intrinsic diode thereof is used for that purpose. The standard IGBT, on account of its internal structure, is not able to conduct current in the reverse direction without a further component. If reverse conductivity is required, a diode is usually connected in antiparallel with the IGBT component. However, this results in some undesired consequences. The housing for at least one IGBT has to be selected with an appropriate size, such that there is space not only for the transistor chip but also for the diode chips. The wiring outlay during bonding increases since now a higher number of chips have to be interconnected. The entire manufacturing chain necessitates implementing greater outlay and effort since special diode chips also have to be manufactured, measured, kept available and processed, besides the transistor chips. By decoupling the forward (IGBT) and reverse current carrying (diode), both processes are thermally decoupled to the greatest possible extent. The thermal resistance for the individual elements is correspondingly high.

It is known for an IGBT and a diode to be monolithically integrated in one another. This is done by the p-doped collector zone (p-type emitter) of the IGBT being locally interrupted. At these locations, n-doped semiconductor material (n-type cathode of the diode) contacts the collector metalization. A PIN diode structure thus arises between the emitter, the lightly doped drift zone and the p-doped material in the MOS channel region. Such an IGBT is referred to as a reverse-conducting IGBT (for short: RC-IGBT). Such an RC-IGBT is described for example in the document US 2007/0231973 A1 (Rüthing, Schulze, Niedernostheide, Hille).

While the conducting behavior of a separate diode connected in antiparallel with the IGBT exhibits no dependence on the drive state of the IGBT, the situation is different for the RC-IGBT depending on the design of the component. If the RC-IGBT is driven in reverse-conducting operation (i.e. in diode operation), then the MOS channel of the IGBT is conducting. Since the latter can carry current in both directions, an additional current path, in parallel with the internal diode, arises for the electrons of the reverse current. Since this means that now not all the electrons contribute to the flooding of the PIN diode structure, the forward voltage drop thereof can increase significantly, which is generally an undesired effect. For this reason, in most applications it is desirable to drive the gate of a reverse-conducting IGBT in the off state in diode operation (i.e. to turn off the MOS channel of the IGBT).

Upon transition from the on state to the off state, the charge stored in the component in the steady-state diode flooding situation should be extracted in order to keep the dynamic losses small. This quantity of charge is also called "reverse recovery" charge and has a considerable influence on the diode switch-off losses and on the IGBT switch-on losses of the commutation partner (for example a further IGBT in the case of an arrangement of two IGBTs in a half-bridge). On account of the properties described, low-loss diode operation can be implemented if, in the operating sequence of the application circuit, different states of the intrinsic freewheeling diode with regard to the flooding thereof (charge carrier flooding) are combined in such a way that the sum of application-specifically arising static and dynamic losses yields a minimum.

SUMMARY

Therefore, the object on which the invention is based is to provide a circuit and a method for driving reverse-conducting IGBTs by which comparatively low losses are made possible. This object is achieved by means of the circuit as claimed in claim 1 or 6 and by means of the method for driving a semiconductor switch as claimed in claim 10. The dependent claims relate to various exemplary embodiments and further developments of the invention.

A drive circuit for driving a control electrode of a semiconductor switch is disclosed. In accordance with one embodiment, the drive circuit includes a first output node for connection to the control electrode of the semiconductor switch, a voltage supply circuit, and a first switching stage connected to the voltage supply and a second switching stage connected to the voltage supply. A first resistor network is connected between the first switching stage and the first output node. A second resistor network is connected between the second switching stage and the first output node. A control logic is designed to generate control signals for the guiding of the first switching stage and the second switching stage in such a way that in a first operating mode of the semiconductor switch the semiconductor switch is driven only via the first resistor network, and in a second operating mode of the semiconductor switch the semiconductor switch is driven only via the second resistor network or both resistor networks.

In accordance with a further exemplary embodiment, the drive circuit includes a first output node for connection to the control electrode of the semiconductor switch, and a reference node for connection to a load electrode of the semiconductor switch. The drive circuit furthermore includes a voltage supply circuit and also a first transistor half-bridge, a second transistor half-bridge and a third transistor half-bridge, wherein each transistor half-bridge is connected to the voltage supply and has a bridge output node. A first resistor network is connected between the bridge output node of the first transistor half-bridge and the first output node. A second resistor network is connected between the bridge output node of the second transistor half-bridge and the first output node. The bridge output node of the third transistor half-bridge is connected to the reference node.

Furthermore, a method for driving a semiconductor switch is disclosed. In accordance with one embodiment, the method includes, in a first operating mode, connecting a control terminal of the semiconductor switch to a first or a second terminal of a voltage source via a first resistor network depending on at least one control signal with the aid of a first switching stage. In a second operating mode, the method includes connecting the control terminal of the semiconductor switch to the first or the second terminal of the voltage source via a second resistor network depending on the at least one control signal with the aid of a second switching stage. In both operating modes, a load terminal of the semiconductor switch is connected to the first or the second terminal of the voltage source depending on the at least one control signal and with the aid of a third switching stage.

BRIEF DESCRIPTION OF THE DRAWINGS

Embodiments of the invention are explained in greater detail below on the basis of the examples illustrated in the drawings. The illustrations are not necessarily true to scale and the invention is not just restricted to the aspects illustrated. Rather, importance is attached to illustrating the principles underlying the invention. In the drawings.

In the drawings, identical reference signs designate identical or corresponding parts having an identical or similar meaning.

DETAILED DESCRIPTION

As already mentioned above, the conducting behavior of a separate diode connected in antiparallel with an IGBT exhibits no dependence on the drive state of the IGBT. With the use of RC-IGBTs (reverse-conducting IGBTs), the forward voltage drop across the emitter-collector load path of the IGBT, which corresponds to the anode-cathode load path of the integrated (intrinsic) diode, rises to an undesired extent if the gate of the RC-IGBT is driven in the on state in reverse-conducting operation and the MOS channel of the IGBT is therefore conducting. Since the latter can carry current in both directions, an additional current path, in parallel with the intrinsic diode, arises for the electrons of the reverse current and now not all the electrons can contribute to the flooding of the PIN diode structure, which has the effect that the voltage drop across the intrinsic diode increases significantly.

Figure 1:
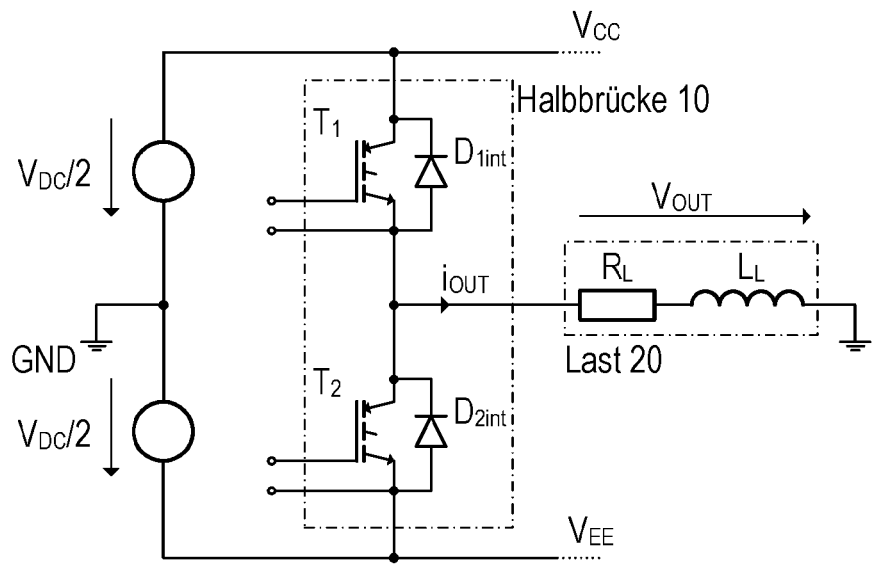
FIG. 1 shows an IGBT half-bridge with an ohmic-inductive load, according to an embodiment.

A typical application for RC-IGBTs is power converters, where an IGBT half-bridge is used for controlling each phase current. Such a half-bridge 10 is illustrated in FIG. 1. A half-bridge 10 consists, for example, of two series-connected n-channel IGBTs $T_1$ and $T_2$, wherein the operating voltage $V_{DC}$ (intermediate circuit voltage, DC-link voltage) is present across the half-bridge 10. That is to say that the voltage from the collector of the high-side transistor $T_1$ to the emitter of the low-side transistor $T_2$ corresponds to the operating voltage $V_{DC}$. The collector potential of the high-side transistor $T_1$ is designated by $V_{CC}$ and the emitter potential of the low-side transistor $T_2$ is designated by $V_{EE}$. The common circuit node of the two transistors $T_1$ and $T_2$ forms the output of the half-bridge 10, via which the output current (phase current) $i_{OUT}$ flows away through a load 20. In many applications, the load 20 comprises an inductance $L_L$ and an ohmic resistance $R_L$. The intermediate circuit voltage $V_{DC}$ is usually symmetrical with respect to a reference potential $V_{GND}$, i.e. $V_{CC}=V_{DC}/2$ and $V_{EE}=-V_{DC}/2$. In this case, the load 20 is connected between the bridge output and the reference potential node GND.

Figure 2:
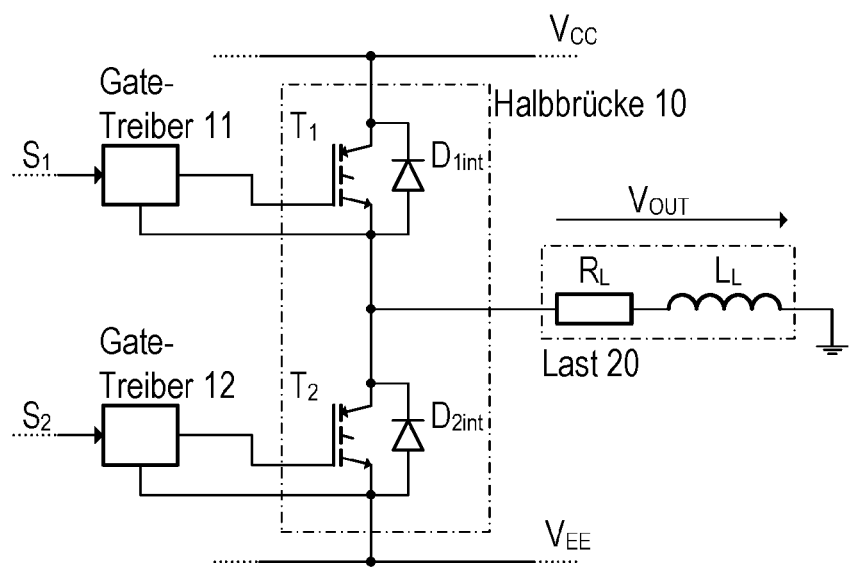
FIG. 2 shows the IGBT half-bridge from FIG. 1 with a gate driver circuit for each transistor, according to an embodiment.

For controlling the bridge output current (phase current) $i_{OUT}$, for each transistor provision can be made of a drive circuit 11 and respectively 12 for driving the gate electrode of the respective transistors $T_1$ and $T_2$. These drive circuits 11, 12 are often referred to as gate drivers or driver circuits and can be designed, upon switching for the bridge output current $i_{OUT}$, to achieve a certain temporal profile of the output current edges (edge-shaping), and/or to prevent a bridge short circuit. (Binary) control signals $S_1$ and respectively $S_2$ indicating the desired switching state of the respective transistor $T_1$, $T_2$ are fed to the gate drivers 11, 12. A half-bridge 10 with driver circuits 11, 12 for gate driving is illustrated in FIG. 2. Apart from the driver circuits 11 and 12, which are connected to the gate and emitter terminals of the respective transistors $T_1$ and $T_2$, FIG. 2 shows the same components as FIG. 1.

Figures 3, 4:
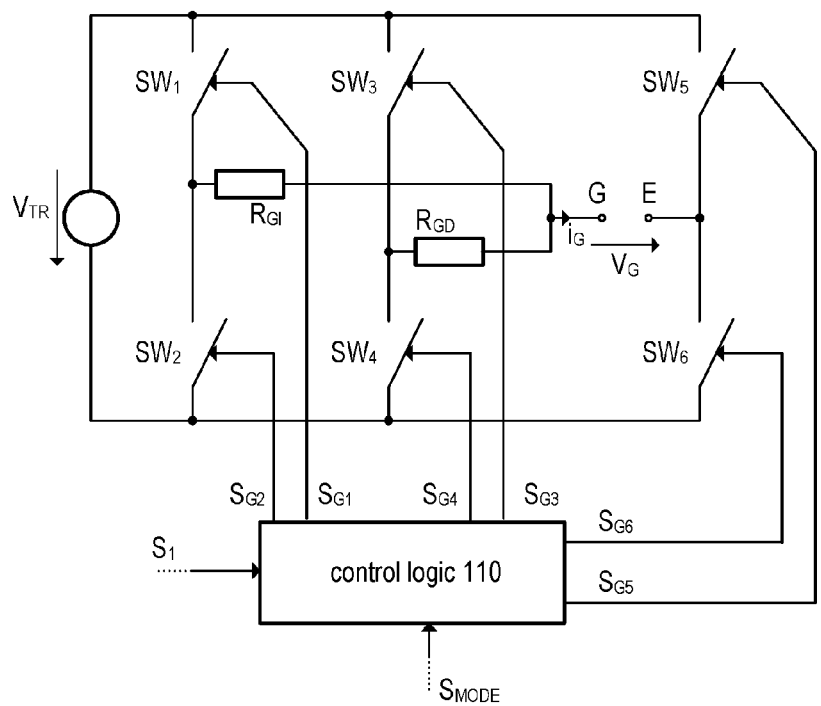
FIG. 3 is a table in which the on states of the IGBTs of the half-bridge from FIG. 2 depending on the direction of the load current of the respective IGBT are compiled, according to an embodiment.
FIG. 4 is one example of a circuit for driving an RC-IGBT, according to an embodiment.

FIG. 3 illustrates all four possible switching states of a half-bridge. Depending on the predefinitions of the control signals $S_1$ and $S_2$ and the current direction, which is usually predefined by the inductive load 20, the output potential at the bridge output assumes the value $V_{EE}=-V_{DC}/2$ or $V_{CC}=V_{DC}/2$. Hereinafter, $S_1=0$ and $S_2=0$ means that the respective transistor $T_1$ and $T_2$ is intended to be switched off (blocking MOS channel), and $S_1=1$ and $S_2=1$ means that the respective transistor $T_1$ and $T_2$ is intended to be switched on (conducting MOS channel).

In state I (see FIG. 3), both RC-IGBTs $T_1$ and $T_2$ are driven in the off state and the output current $i_{OUT}$ can flow only via one of the intrinsic diodes $D_{1int}$ or $D_{2int}$. That is to say that, depending on the current direction of the output current $i_{OUT}$, the intrinsic freewheeling diode $D_{1int}$ or $D_{2int}$ of the high-side transistor or of the low-side transistor is in the on state and the output potential is thus $V_{EE}$ (given a positive output current $i_{OUT}$) or $V_{CC}$ (given a negative output current $i_{OUT}$). This holds true only approximately, disregarding the forward voltage of the intrinsic diodes $D_{1int}$ and $D_{2int}$. In both cases, either the high-side transistor $T_1$ or the low-side transistor $T_2$ is reverse-conducting.

In state II, only the low-side transistor $T_2$ is driven in the on state ($S_1=0$, $S_2=1$). The output potential $V_{OUT}$ thus corresponds approximately to the potential $V_{EE}$ independently of the current direction of the output current $i_{OUT}$.

Given a positive output current ($i_{OUT}>0$), however, the low-side transistor $T_2$ is reverse-conducting, while it conducts in the forward direction in the case of a negative output current ($i_{OUT}<0$).

In state III, the substantive situation is exactly opposite to state II. In state III, only the high-side transistor $T_1$ is driven in the on state ($S_1=1$, $S_2=0$). The output potential $V_{OUT}$ thus corresponds approximately to the potential $V_{CC}$ independently of the current direction of the output current $i_{OUT}$. Given a negative output current ($i_{OUT}<0$), however, the high-side transistor $T_1$ is reverse-conducting, while it conducts in the forward direction given a positive output current ($i_{OUT}>0$).

In state IV, which is present theoretically but should absolutely be avoided in practice, both transistors $T_1$ and $T_2$ are driven in the on state ($S_1=1$, $S_2=1$). In this case, however, the intermediate circuit voltage $V_{DC}$ is short-circuited by the half-bridge. This state can lead to the destruction of the half-bridge. A task of the driver circuits mentioned above is to prevent the (even just momentary) occurrence of such a state.

In states II and III, in the case of conventional driving of the transistors, the problem described above occurs that, in the case where a transistor is driven in the on state but is reverse-conducting, the voltage drop across the load path (emitter-collector current path) of the RC-IGBT is undesirably high, which results in an increased power loss and evolution of heat. Specifically, this problem occurs in the case of a positive output current $i_{OUT}$ in state II and in the case of a negative output current $i_{OUT}$ in state III.

In known driving circuits for RC-IGBTs, upon a change into a reverse-conducting state, the control signal $S_1$ or respectively $S_2$ assigned to the relevant transistor $T_1$ or $T_2$ is blanked (e.g. with the aid of a logic gate) and this brings about a turn-off of the RC-IGBT. A change into the reverse-conducting state can be detected in various ways, for example by means of a measurement of the collector current or the collector-emitter voltage of the relevant transistor. Various approaches for this are known e.g. from the publication DE 10 2009 001 029 B4.

FIG. 4 illustrates one example of a drive circuit (cf. FIG. 2, drive circuits 11 and 12) for efficiently driving an RC-IGBT. In this context, efficient driving of the IGBT is understood to mean driving which results in little power loss. In the present example, the drive circuit comprises three switching stages embodied as transistor half-bridges and each having two series-connected electronic switches. The first half-bridge comprises the switches $SW_1$ and $SW_2$, the second half-bridge comprises the switches $SW_3$ and $SW_4$, and the third half-bridge comprises the switches $SW_5$ and $SW_6$. The three switching stages (e.g. half-bridges) are each supplied with the voltage $V_{TR}$ provided by a voltage source $Q_{TR}$ (voltage supply of the drive circuit, for example a capacitor). The voltage $V_{TR}$ can be +15V, for example. Each half-bridge has a center tap (output node of the respective half-bridge). The center tap of the first half-bridge (common circuit node of the switches $SW_1$ and $SW_2$) is designated as node A, the center tap of the second half-bridge (common circuit node of the switches $SW_3$ and $SW_4$) is designated as node B, and the center tap of the third half-bridge (common circuit node of the switches $SW_5$ and $SW_6$) is designated as node C. The drive circuit has two output nodes, of which a first output node (designated by G in FIG. 4) is connected to the gate terminal of the transistor to be driven and a second output node (designated by E in FIG. 4), referred to as a reference node, is connected to the emitter terminal of the transistor to be driven. At least one first gate resistor $R_{GI}$ is connected between the node A and the first output node, and at least one second gate resistor $R_{GD}$ is connected between the node B and the first output node. The second output node is connected to the node C. The functioning of the circuit will be explained in greater detail below with reference to FIGS. 5 and 6. The resistors $R_{GI}$ and $R_{GD}$ can generally be replaced by resistor networks that can comprise one or a plurality of resistors and optionally also further electronic components (e.g. diodes).

The control signals $S_{G1}$, $S_{G2}$, $S_{G3}$, $S_4$, $S_{G5}$, and $S_{G6}$ for switching the switches $SW_1$, $SW_2$, $SW_3$, $SW_4$, $SW_5$ and $SW_6$ on and off can be generated for example by a control logic circuit 110 integrated in the drive circuit. Alternatively, the control signals $S_{G1}$, $S_{G2}$, $S_{G3}$, $S_{G4}$, $S_{G5}$, and $S_{G6}$ can also be generated in an external, separate control logic (cf. FIG. 10, control logic 15). In the example illustrated, the control logic 110 is designed to generate the control signals $S_{G1}$, $S_{G2}$, $S_{G3}$, $S_{G4}$, $S_{G5}$, and $S_{G6}$ depending on the input signals $S_1$ and $S_{MODE}$. In this case, the input signal $S_1$ indicates whether the IGBT is intended to be switched on or off, and the input signal $S_{MODE}$ indicates the present operating mode (diode operation or IGBT operation) of the RC-IGBT. For the generation of the input signal $S_{MODE}$, reference should be made to the examples in accordance with FIGS. 9 and 10.

Figures 5, 6:
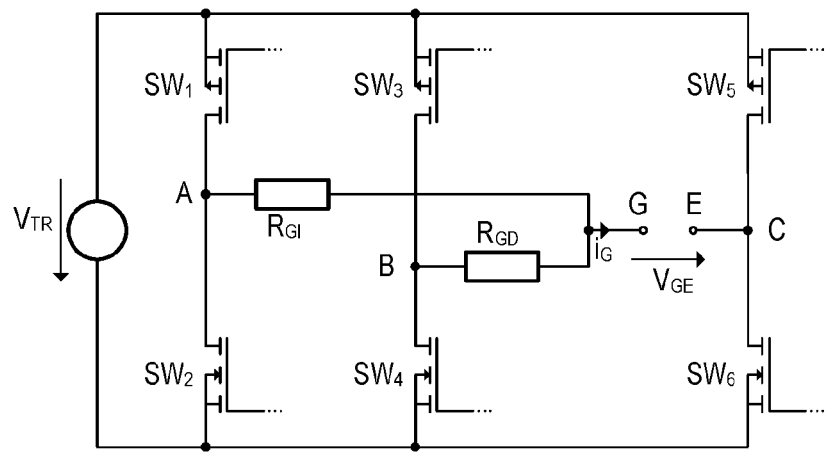
FIG. 5 shows one possible implementation of the example from FIG. 4 by means of three MOSFET half-bridges, according to an embodiment.
FIG. 6 is a table indicating possible switching states of the half-bridges from the examples in accordance with FIGS. 4 and 5, according to an embodiment.

The example from FIG. 5 is substantially identical to the example from FIG. 4, the switches $SW_1$, $SW_2$, $SW_3$, $SW_4$, $SW_5$ and $SW_6$ being implemented as MOS field effect transistors. The individual half-bridges can be embodied e.g. as CMOS inverters. The digital switching mechanism for driving the MOSFET switches $SW_1$, $SW_2$, $SW_3$, $SW_4$, $SW_5$ and $SW_6$ is not illustrated, for the sake of simplicity. Depending on the switching state of the MOSFETs $SW_1$, $SW_2$, $SW_3$, $SW_4$, $SW_5$ and $SW_6$, the output voltage $V_{GE}$ of the drive circuit in the settled state can be $V_{TR}$ or $-V_{TR}$. In the following description, the RC-IGBT to be driven is in IGBT operation if it is in the forward-conducting state or changes from the forward-conducting state into the blocking state (or vice versa). The RC-IGBT is in diode operation if it is in the reverse-conducting state or changes from the reverse-conducting state into the blocking state (or vice versa).

IGBT operation is therefore present if a switch-on of the component ($V_{GE}>V_{TH}$) leads to a change from the blocking state into the forward-conducting state or, when the component is switched off ($V_{GE}<V_{TR}$), a change from the forward-conducting state into the blocking state occurs. In IGBT operation, the gate of the RC-IGBT is charged and discharged via the resistor $R_{GI}$. In this case, the resistor $R_{GI}$ is utilized in order to influence the switch-on or -off operation of the RC-IGBT in IGBT operation. Diode operation is present if a switch-on ($V_{GE}>V_{TR}$) or a switch-off ($V_{GE}<V_{TR}$) of the RC-IGBT of the component does not lead to a change from the blocking state into a conducting state, and vice versa. In diode operation, the gate of the RC-IGBT is charged and discharged via the resistor $R_{GD}$.

In IGBT operation, the switch-on and -off of the relevant RC-IGBT results in a commutation of the load current $i_{OUT}$. That is to say that, for the example of an IGBT-half-bridge as shown in FIG. 2, the high-side IGBT accepts the load current $i_{OUT}$ from the low-side IGBT, and vice versa. In this case—as mentioned above—the resistance of the gate resistor $R_{GI}$ determines the steepness of the switching edges. As will be explained later (see FIG. 7), said resistance can be chosen differently for the switch-on and the switch-off. In diode operation, the switch-on and -off of the relevant RC-IGBT does not result in a commutation of the load current. The resistance of the gate resistor $R_{GD}$ can therefore be set to very small values. Particularly if diode desaturation takes place directly before the turn-off of the intrinsic diode (see FIG. 2, diodes $D_{1int}$, $D_{2int}$), it can be advantageous to subject the gate of the reverse-conducting IGBT to charge reversal with a small time constant.

FIG. 6 shows a table in which the most important (but not all possible and permissible) switching states of the switches $SW_1$, $SW_2$, $SW_3$, $SW_4$, $SW_5$ and $SW_6$ of the drive circuit from FIG. 5 are compiled. In the state designated by No. 1, the switches $SW_1$ and $SW_6$ are switched on and all other switches of the gate driver circuit (see FIG. 5) are switched off. The gate of the RC-IGBT is charged up to a voltage $+V_{TR}$ (e.g. +15V) via the resistor $R_{GI}$. The RC-IGBT is thus switched on and changes—in IGBT operation—from a blocking state into a state conducting in the forward direction.

In the state designated by No. 2, the switches $SW_2$ and $SW_5$ are switched on and all other switches of the gate driver circuit (see FIG. 5) are switched off. The gate of the RC-IGBT is discharged down to a voltage $-V_{TR}$ (e.g. -15V) via the resistor $R_G$, (and charged in the opposite direction). The RC-IGBT is switched off and changes—in IGBT operation—from a state conducting in the forward direction into the blocking state. In order to achieve a "soft" turn-off, a change could be made e.g. from state No. 1 (IGBT switched on and conducting in forward direction) not directly into state No. 2, but rather firstly into state No. 3 (see below), and then into state No. 2.

In the state designated by No. 3, the switches $SW_1$ and $SW_5$ are switched on and all other switches of the gate driver circuit (see FIG. 5) are switched off. The gate of the RC-IGBT is discharged down to a voltage of 0 V via the resistor $R_{GI}$. The RC-IGBT is switched off and changes—in IGBT operation—from a state conducting in the forward direction into the blocking state. The steady-state voltage $V_{GE}$ is 0 volts. Therefore, the turn-off speed is reduced in comparison with state No. 2. This state could be expedient in the case of an overcurrent turn-off.

In states No. 1 to No. 3, only the first half-bridge ($SW_1$, $SW_2$) and the third half-bridge ($SW_5$, $SW_6$) are in operation. Accordingly, the gate resistor $R_{GI}$ is crucial for charging and discharging the gate of the RC-IGBT. In states No. 4 to No. 6, only the second half-bridge ($SW_3$, $SW_4$) and the third half-bridge ($SW_5$, $SW_6$) are in operation. Accordingly, the gate of the RC-IGBT is charged and discharged via the gate resistor $R_{GD}$. In the state designated by No. 4, the switches $SW_3$ and $SW_6$ are switched on and all other switches of the gate driver circuit (see FIG. 5) are switched off. The gate of the RC-IGBT is charged up to a voltage $+V_{TR}$ (e.g. +15V) via the resistor $R_{GD}$. In diode operation, the RC-IGBT is thus switched on and undergoes transition from the more highly flooded diode conducting state to the least flooded diode conducting state.

In the state designated by No. 5, the switches $SW_4$ and $SW_5$ are switched on and all other switches of the gate driver circuit (see FIG. 5) are switched off. The gate of the RC-IGBT is discharged down to a voltage $-V_{TR}$ (e.g. -15V) via the resistor $R_{GD}$ (and charged in the opposite direction). If diode operation is present, the RC-IGBT is switched off and undergoes transition to the most highly flooded diode conducting state.

In the state designated by No. 6, the switches $SW_3$ and $SW_5$ are switched on and all other switches of the gate driver circuit (see FIG. 5) are switched off. The gate of the RC-IGBT is discharged down to a voltage of 0 V via the resistor $R_{GD}$. If diode operation is present, the RC-IGBT is switched off and undergoes transition to a moderately flooded diode conducting state.

In the states designated by No. 3 and No. 6, instead of the switches $SW_1$ and $SW_5$, and respectively $SW_3$ and $SW_5$, the switches $SW_2$ and $SW_6$, and respectively $SW_4$ and $SW_6$, could also be switched on. In these cases, too, the steady-state gate-emitter voltage $V_{GE}$ would be zero.

Figure 7:
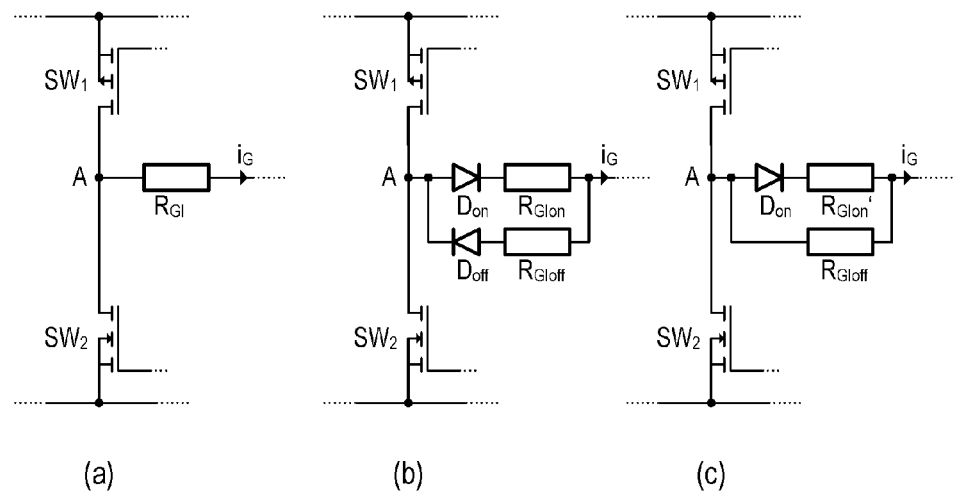
FIG. 7 shows various embodiments of a first half-bridge from the example in accordance with FIG. 5, according to an embodiment.

FIG. 7 illustrates various exemplary embodiments of the first half-bridge ($SW_1$, $SW_2$) with gate resistor. The variant in accordance with FIG. 7a was implemented in the gate driver circuit in accordance with FIG. 5. The gate resistor $R_{GI}$ can also be replaced by a more complex circuit (resistor network) which enables various effective gate resistors for charging and discharging the gate. In accordance with the variant from FIG. 7b, a parallel circuit formed from two series circuits each comprising a diode $D_{on}$ and respectively $D_{off}$ and a resistor $R_{GIon}$ and respectively $R_{GIoff}$ is used instead of an individual gate resistor $R_{GI}$. The diodes $D_{on}$ and respectively $D_{off}$ are oriented oppositely, such that either only the first series circuit formed from diode $D_{on}$ and resistor $R_{GIon}$ or the second series circuit formed from diode $D_{off}$ and resistor $R_{GIoff}$ is effective, depending on the direction of the gate current $i_G$. In the present example, therefore, the gate of the RC-IGBT is charged via the resistor $R_{GIon}$ ($i_G$>0) and discharged via the resistor $R_{GIoff}$ ($i_G$<0). In the variant from FIG. 7c, a parallel circuit formed from a resistor $R_{GIoff}$ and a series circuit formed from diode $D_{on}$ and resistor $R_{GIon'}$ is used instead of an individual resistor $R_{GI}$ (as in FIG. 7a). The diode $D_{on}$ is oriented in such a way that it is in the on state in the case of a positive gate current $i_G$. Accordingly, only the resistor $R_{Goff}$ is effective (diode $D_{on}$ is in the off state) upon the discharging ($i_G$<0) of the gate of the RC-IGBT, whereas the parallel circuit comprising the resistors $R_{GIon'}$ and $R_{GIoff}$ (disregarding the differential resistance of the diode $D_{on}$) is effective upon the charging of the gate of the RC-IGBT. The resistance $R_{GIon}$ effective upon charging is accordingly $R_{GIon}=R_{GIon'} \cdot R_{GIoff}/(R_{GIon'}+R_{GIoff})$.

Figure 8:
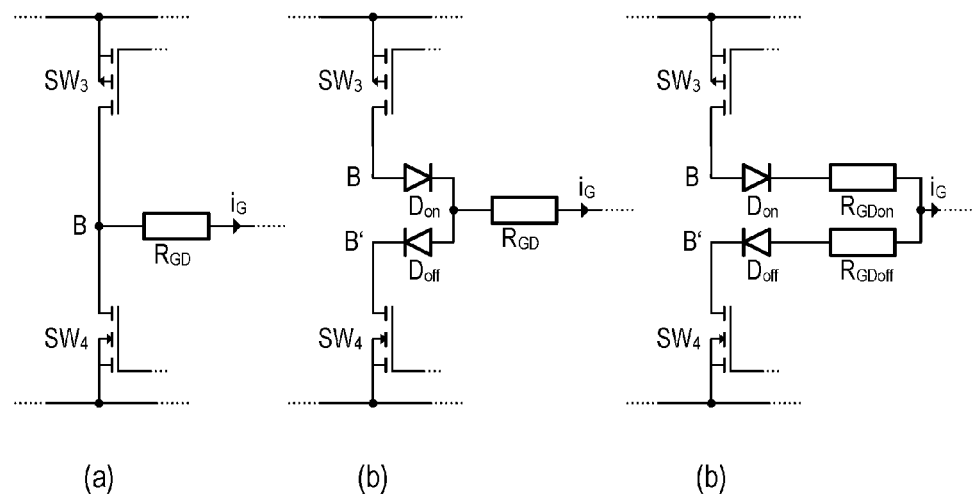
FIG. 8 shows various embodiments of a second half-bridge from the example in accordance with FIG. 5, according to an embodiment.

FIG. 8 illustrates various exemplary embodiments of the second half-bridge ($SW_3$, $SW_4$) with gate resistor. The variant in accordance with FIG. 8a (only an individual gate resistor $R_{GD}$ for diode operation) was implemented in the gate driver circuit in accordance with FIG. 5. In accordance with FIG. 8a, the center tap (node B) of the half-bridge is connected to the first output terminal G of the gate driver circuit via the resistor $R_{GD}$. In accordance with the variant from FIG. 8b, in each case a diode $D_{on}$ and respectively $D_{off}$ is connected between each of the two switches $SW_3$ and $SW_4$ and the node B, which diodes can each be embodied e.g. as a Schottky diode. To put it another way, in comparison with the variant from FIG. 8a, the MOSFETs $SW_3$ and $SW_4$ are in each case replaced by a series circuit formed from MOSFET and (Schottky) diode ($SW_3$-$D_{on}$ and $D_{off}$-$SW_4$). In the variant in accordance with FIG. 8c—in a manner similar to that in the example from FIG. 7b—a different effective resistance is used for charging and discharging the gate. In this case (compared with the variant from FIG. 8b) the half-bridge is interrupted at the center tap (circuit nodes B and B'), and the diodes $D_{on}$ and $D_{off}$ each with a different resistor, $R_{GDon}$ and respectively $R_{GDoff}$, are connected to the output terminal (G) of the gate driver circuit. The ohmic resistance of the resistor network (e.g. components $R_{on}$, $R_{off}$, $D_{on}$, $D_{off}$) therefore depends on the current direction through the resistor network.

The described use of the (Schottky) diodes $D_{on}$, $D_{off}$ ensures, inter alia, that in IGBT operation solely the resistors (see FIGS. 7a-c, resistors, $R_{GI}$, $R_{GIon}$, $R_{GIon'}$, $R_{GIoff}$) connected in the first half-bridge (switches $SW_1$, $SW_2$) are effective. At least the switches $S_1$ to $S_4$ will often be implemented as MOSFETs. These transistors have an intrinsic diode—also called body diode—in a manner governed by their topology. If a change were made for example from state No. 1 into state No. 2 according to Table 1, part of the gate current $i_G$ would flow through the body diodes of the switches $SW_3$ and $SW_4$ at least temporarily if the diodes $D_{on}$ and $D_{off}$ were not present (as in FIG. 5 or 8a). This additional current path through the body diodes of the switches $SW_3$ and $SW_4$ would alter the effective resistance $R_{GI}$ which is switched with the first half-bridge ($SW_1$, $SW_2$). This effect is avoided by the diodes $D_{on}$ and $D_{off}$ in the variants in accordance with FIGS. 8b and 8c.

Figure 9:
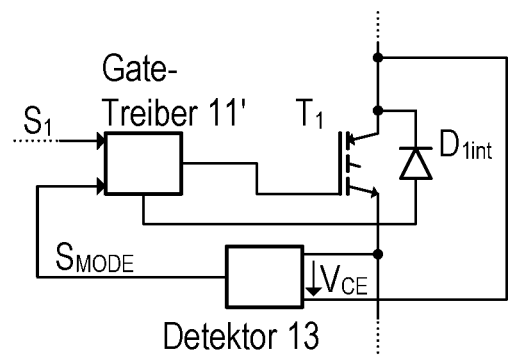
FIG. 9 shows one exemplary application of a circuit for driving an RC-IGBT in accordance with the example from FIG. 4, according to an embodiment.

FIG. 9 illustrates one application of a gate driver circuit 11' which can be constructed in accordance with the exemplary embodiments described above (see FIGS. 4 to 8). FIG. 9 shows an RC-IGBT $T_1$ having an intrinsic freewheeling diode $D_{1int}$. The RC-IGBT $T_1$ can be for example part of a half-bridge circuit (see FIGS. 1 and 2). In accordance with a (binary) control signal $S_1$, a gate driver 11' generates a driver signal (gate current or gate-emitter voltage) that is fed to the gate electrode. A detector circuit 13 is designed to detect an operating mode of the IGBT, i.e. to determine whether the RC-IGBT is operating in IGBT operation or in diode operation. Such detector circuits are known per se and are therefore not described any further. By way of example, the detector circuit can evaluate the load current (collector current) of the IGBT or the voltage $V_{CE}$ across the load current path (collector-emitter current path or anode-cathode current path). Diode operation can be detected, for example, if the collector-emitter voltage $V_{CE}$ has a zero crossing and becomes negative. The detector circuit can be designed to indicate the operating mode (diode operation or IGBT operation) by means of a binary signal $S_{MODE}$. In the present example, the signal $S_{MODE}$ is fed to the gate driver circuit 11'.

Figure 10:
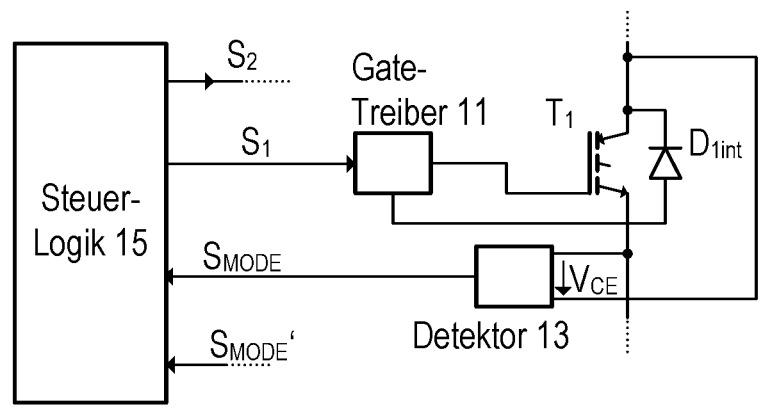
FIG. 10 shows a further exemplary application of a circuit for driving an RC-IGBT in accordance with the example from FIG. 4, according to an embodiment.

The driver circuit 11' can be designed to drive the half-bridges ($SW_1$, $SW_2$ and $SW_3$, $SW_4$ and $SW_5$, $SW_6$) of the driver circuit 11' depending on the level of the signal $S_{MODE}$ and depending on the control signal $S_1$. Alternatively, the detector signal $S_{MODE}$ can be fed to a central control logic 15, which generates the control signal $S_1$ (and, if appropriate, further control signals $S_2$ for further gate driver circuits) depending on the detector signal $S_{MODE}$ (and, if appropriate, further detector signals $S_{MODE'}$ of further detector circuits (not illustrated) which are coupled to further RC-IGBTs (not illustrated)). This situation is illustrated in FIG. 10, for example. The control signal $S_1$ can represent for example a switching state in accordance with the table from FIG. 6. Instead of a control signal $S_1$, the individual control signals for the individual switches (see FIG. 4, $SW_1$ to $SW_6$, with control signals $S_{G1}$ to $S_{G6}$) can also be generated directly by the central control logic 15. By way of example, in a three-phase power converter, a control logic can generate six control signals for six gate driver circuits, wherein each gate driver circuit drives an RC-IGBT, and two RC-IGBTs are in each case interconnected to form a half-bridge.

The invention claimed is:

1. A drive circuit for driving a control electrode of a semiconductor switch, comprising the following:
   a first output node for connection to the control electrode of the semiconductor switch;
   a voltage supply circuit,
   a first switching stage connected to the voltage supply and
   a second switching stage connected to the voltage supply;
   a first resistor network, which is connected between the first switching stage and the first output node;
   a second resistor network, which is connected between the second switching stage and the first output node;
   a first reference node for connection to a load electrode of the semiconductor switch, and
   a control logic, which is designed to generate control signals for the guiding of the first switching stage and the second switching stage in such a way that
   in a first operating mode of the semiconductor switch the semiconductor switch is driven only via the first resistor network, and
   in a second operating mode of the semiconductor switch the semiconductor switch is driven only via the second resistor network or both resistor networks.

2. The drive circuit as claimed in claim 1, wherein the first switching stage and the second switching stage each comprise a transistor half-bridge having in each case a high-side transistor and a low-side transistor.

3. The drive circuit as claimed in claim 1, further comprising a third switching stage connected to the voltage supply, said third switching stage being coupled to the reference node.

4. The drive circuit as claimed in claim 3, wherein the first, second and third switching stages each comprise a transistor half-bridge having in each case a high-side transistor and a low-side transistor.

5. A drive circuit for driving a control electrode of a semiconductor switch, comprising the following:
   a first output node for connection to the control electrode of the semiconductor switch; and
   a reference node for connection to a load electrode of the semiconductor switch;
   a voltage supply circuit,
   a first transistor half-bridge, a second transistor half-bridge and a third transistor half-bridge; wherein each transistor half-bridge is connected to the voltage supply and has a bridge output node;
   a first resistor network, which is connected between the bridge output node of the first transistor half-bridge and the first output node;
   a second resistor network, which is connected between the bridge output node of the second transistor half-bridge and the first output node, and
   wherein the bridge output node of the third transistor half-bridge is connected to the reference node.

6. The drive circuit as claimed in claim 5, further comprising a control logic, which is designed to generate control signals for the driving of the transistors of the three transistor half-bridges in such a way that:
   in a first operating mode of the semiconductor switch the semiconductor switch is driven only via the first resistor network, and
   in a second operating mode of the semiconductor switch the semiconductor switch is driven only via the second resistor network or both resistor networks.

7. The drive circuit as claimed in claim 5, wherein the first resistor network comprises at least one diode.

8. The drive circuit as claimed in claim 5, wherein the second half-bridge has a further bridge output node and both bridge output nodes of the second transistor half-bridge are connected to the output node via the second resistor network.

9. A method for driving a semiconductor switch, comprising the following:
   in a first operating mode:

connecting a control terminal of the semiconductor switch to a first or a second terminal of a voltage source via a first resistor network depending on at least one control signal with the aid of a first switching stage;

in a second operating mode:

connecting the control terminal of the semiconductor switch to the first or the second terminal of the voltage source via a second resistor network depending on the at least one control signal with the aid of a second switching stage; and in both operating modes connecting a load terminal of the semiconductor switch to the first or the second terminal of the voltage source depending on the at least one control signal with the aid of a third switching stage.

10. The method as claimed in claim 9, further comprising:

detecting the second operating mode if the semiconductor switch conducts in a reverse direction; and detecting the first operating mode if the semiconductor switch does not conduct in the reverse direction.

* * * * *